(12) United States Patent
Sugahara (10) Patent No.: US 7,120,076 B2
(45) Date of Patent: Oct. 10, 2006

(54) SEMICONDUCTOR MEMORY DEVICE

(75) Inventor: Takeshi Sugahara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 10/724,098

(22) Filed: Dec. 1, 2003

(65) Prior Publication Data

US 2005/0207246 A1 Sep. 22, 2005

(30) Foreign Application Priority Data

Jul. 31, 2003 (JP) .............................. 2003-204516

(51) Int. Cl.
*G11C 7/00* (2006.01)
(52) U.S. Cl. ...................................... 365/222; 365/228
(58) Field of Classification Search ................ 365/222, 365/228
See application file for complete search history.

(56) References Cited

U.S. PATENT DOCUMENTS 5,724,292 A * 3/1998 Wada ......................... 365/207
6,064,616 A 5/2000 Ciraula et al.
6,711,051 B1 * 3/2004 Poplevine et al. .......... 365/154
2004/0264279 A1 * 12/2004 Wordeman et al. ..... 365/230.05

FOREIGN PATENT DOCUMENTS

JP 6-195977 7/1994

OTHER PUBLICATIONS

U.S. Appl. No. 10/916,524, filed Aug. 12, 2004, Sugahara et al.

* cited by examiner

*Primary Examiner*—M. Tran
(74) *Attorney, Agent, or Firm*—Oblon, Spivak, McClelland, Maier & Neustadt, P.C.

(57) ABSTRACT

There is disclosed a semiconductor memory device which comprises a plurality of bit line pairs each having first and second bit lines arranged in a first direction, a cell array having a plurality of SRAM cells each of which is connected between the first and second bit lines of a corresponding bit line pair via first and second storage nodes, respectively, a plurality of word lines arranged in a second direction crossing the first direction, and a data write circuit which, in the write mode, writes data into an SRAM cell selected by a word line via the first and second bit lines and, in the read mode, rewrites data read onto the first bit line from an SRAM cell selected by a word line onto the first bit line.

11 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2003-204516, filed Jul. 31, 2003, the entire contents of which are incorporated herein by reference.

BACKGROUND OF THE INVENTION

1. Field of the Invention

The present invention relates to a semiconductor memory device and more particularly to an SRAM.

2. Description of the Related Art

As the demand has increased for increasing the capacity and speed of an SRAM, transistors that form SRAM cells have also increasingly advanced in fine structure and speed. As a result, leakage currents that occur in bit lines have increased more and more. The leakage current is caused by a leakage current of an off-state transfer gate transistor in each SRAM cell. If, therefore, the number of SRAM cells connected to one bit line increases, then the total amount of leakage current that occurs in bit lines will increase to a level that cannot be neglected, causing a problem of the occurrence of data read errors. In particular, in a configuration in which only one of the complementary bit lines is used to read data, when the same potential as the precharge potential is read out onto the bit line to which a data read circuit is connected, data must be compensated for by the precharge potential on the bit line that is set at a floating state. This further increases the possibility of data read errors due to the leakage currents.

For precharging, there is a conventional technique in which a precharge circuit that doubles as a write driver is used to precharge a bit line selected at the time of reading from the SRAM (see, for example, Japanese Unexamined Patent Application Disclosure No. 6-195977).

In addition, there is another conventional technique in which a precharge circuit is provided which has a function of, at precharge time, selectively restoring the potential on a bit line connected to an SRAM cell whose discharged condition has been checked in advance (see, for example, U.S. Pat. No. 6,064,616).

With the former technique, however, it is impossible to cope with a drop in the potential on the bit lines due to leakage currents from many SRAM cells after precharging is performed to the bit lines, causing read errors to occur.

With the latter technique, on the other hand, it is possible to cope with a drop in the potential on the bit line connected to an SRAM cell in question; however, as with the former technique, it is impossible to cope with a drop in the potential on the bit lines due to leakage currents from many SRAM cells after precharging, likewise causing read errors to occur.

With the conventional memory devices, when data the potential of which is the same as the precharge potential is read from an SRAM cell onto its associated bit line, the transfer gate transistor provided in the corresponding memory cell is turned off, making it impossible to supply or compensate charges to that bit line. For this reason, the presence of a leakage current from a precharged bit line at data read time causes the potential on it to drop and causes the data read error.

BRIEF SUMMARY OF THE INVENTION

According to an aspect of the present invention, there is provided a semiconductor memory device comprising: a plurality of bit line pairs each having first and second bit lines arranged in a first direction; a cell array having a plurality of SRAM cells each of which is connected between the first and second bit lines of a corresponding bit line pair via first and second storage nodes, respectively; a plurality of word lines arranged in a second direction crossing the first direction; and a data write circuit which, in the write mode, writes data into an SRAM cell selected by a word line via the first and second bit lines and, in the read mode, rewrites data read onto the first bit line from an SRAM cell selected by the word line onto the first bit line.

According to another aspect of the present invention, there is provided a semiconductor memory device comprising: a plurality of bit line pairs each having first and second bit lines arranged in a first direction; a cell array having a plurality of SRAM cells each of which is connected between the first and second bit lines of a corresponding bit line pair via first and second transfer gates having first and second storage nodes, respectively; first and second word lines arranged in a second direction crossing the first direction and connected to the first and second transfer gates, respectively; and a data write circuit which, in the write mode, writes data into an SRAM cell selected by the first and second word lines via the first and second bit lines and, in the read mode, rewrites data read onto at least one of the first and second bit lines from an SRAM cell selected by the activated one of the first and second word lines onto the bit line onto which the data has been read.

BRIEF DESCRIPTION OF THE SEVERAL VIEWS OF THE DRAWING

FIGS. 2A through 2M are timing diagrams for use in explanation of the operation of the SRAM of FIG. 1;

FIGS. 7A through 7K are timing diagrams for use in explanation of the operation of the SRAM of FIG. 5.

DETAILED DESCRIPTION OF THE INVENTION

The present invention will be described in detail hereinafter with reference to the accompanying drawings.

Figure 5:
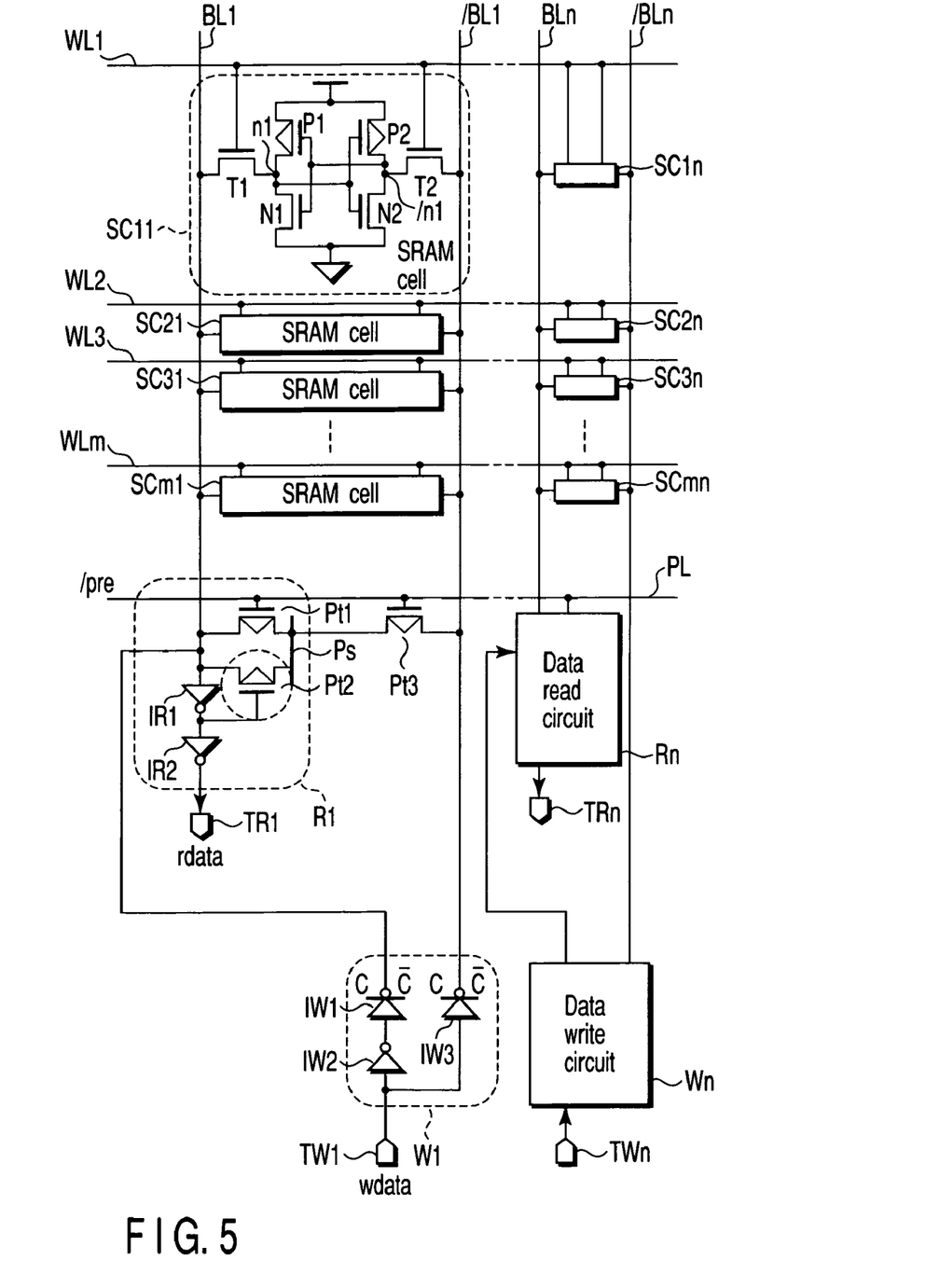
FIG. 5 is a schematic and block diagram representation of an SRAM according to still another embodiment of the present invention.

As an SRAM circuit that has a function of preventing a potential drop due to leakage current from a precharged bit line in the read mode, the inventor first proposed such a circuit arrangement as shown in FIG. 5. A description is given below of this circuit with reference to FIG. 5.

In FIG. 5, there is provided a plurality of pairs of bit lines including first paired bit lines BL1 and /BL1, ..., and n-th paired bit lines BLn and /BLn, which are arranged parallel to one another, in a first or row direction. Between the first paired bit lines BL1 and /BL1 is arranged a first cell array group which has m SRAM cells SC11 to SCm1 each of which is connected to the bit lines via first and second data nodes. In FIG. 5, data nodes n1 and /n1 are only shown as an example. Likewise, the n-th cell array group having m SRAM cells SC1n to SCmn is arranged between the n-th paired bit lines BLn and /BLn. Thus, an SRAM cell array block is formed by arranging a plurality of cell array groups in the row direction.

The SRAM cell, for example, the cell SC11, is formed of a first inverter including a PMOS transistor P1 and an NMOS transistor N1, a second inverter including a PMOS transistor P2 and an NMOS transistor N2, a transfer gate transistor T1 connected between the output node of the first inverter and the bit line BL1, and a transfer gate transistor T2 connected between the data or output node of the second inverter and the bit line /BL1. That is, the cell is comprised of six transistors. The gates of the transistors T1 and T2 are connected in common to a word line WL1 arranged in a column direction crossing the bit lines BL1 and /BL1. Any other SRAM cell is constructed likewise.

A plurality of word lines WL1 to WLm is arranged in the column direction of the cell array. Each of the word lines is connected in common to n SRAM cells arranged in the row direction. Further, in the direction parallel to the word lines WL1 to WLm a precharge line PL is placed which is supplied with an inverted precharge signal /pre.

The bit line BL1 of the paired bit lines BL1 and /BL1 has its one end connected to the read data input terminal of a data read circuit R1. The circuit R1 includes a pair of PMOS transistors Pt1 and Pt2 which are connected in parallel with each other between the bit line BL1 and a precharge source Ps, and inverters IR1 and IR2 which are connected in series between the one end of the bit line BL1 and its associated read data output terminal TR1. The PMOS transistor Pt1 has its gate connected to the precharge line PL and the PMOS transistor Pt2 has its gate connected to the connection point of the inverters IR1 and IR2. Further, at the intersection of the other bit line /BL1 and the precharge line PL is connected a PMOS transistor Pt3 adapted to precharge the bit line /BL1 using the precharge source Ps. Thus, the other end of the PMOS transistor Pt3 is connected to the precharge source Ps.

Though not shown, the data read circuits including a data read circuit Rn and the precharge circuits including PMOS transistors corresponding to the PMOS transistor Pt3 associated with all the other paired bit lines are arranged likewise.

The PMOS transistor Pt2 acts as a state hold circuit which, in response to data read out onto the bit line BL1 in the read mode from a cell (for example, the SRAM cell SC11), selected by a corresponding word line, holds the potential on the bit line BL1 at the precharge potential supplied from the precharge source Ps. That is, only when the data read from the SRAM cell SC11 is at a high level, a low-level signal inverted by the inverter IR1 is applied to the gate of the PMOS transistor Pt2, allowing the potential equal in level to the precharge signal to be applied to the bit line BL1 via the transistor Pt2 from the precharge source Ps.

To the first paired bit lines BL1 and /BL1 is further connected a data write circuit W1 which, in the write mode, applies write data wdata supplied to a data write terminal TW1 to a word-line-selected SRAM cell, for example, the cell SC11 selected by the word line WL1, via the bit lines BL1 and /BL1. This data write circuit W1 has a clocked inverter IW1 and an inverter IW2 which are connected in series between the data write terminal TW1 and the bit line BL1 and a clocked inverter IW3 connected between the data write terminal TW1 and the bit line /BL1. A plurality of data write circuits thus arranged are connected to each of the bit line pairs BL1 and /BL1 through BLn and /BLn.

Figure 6:
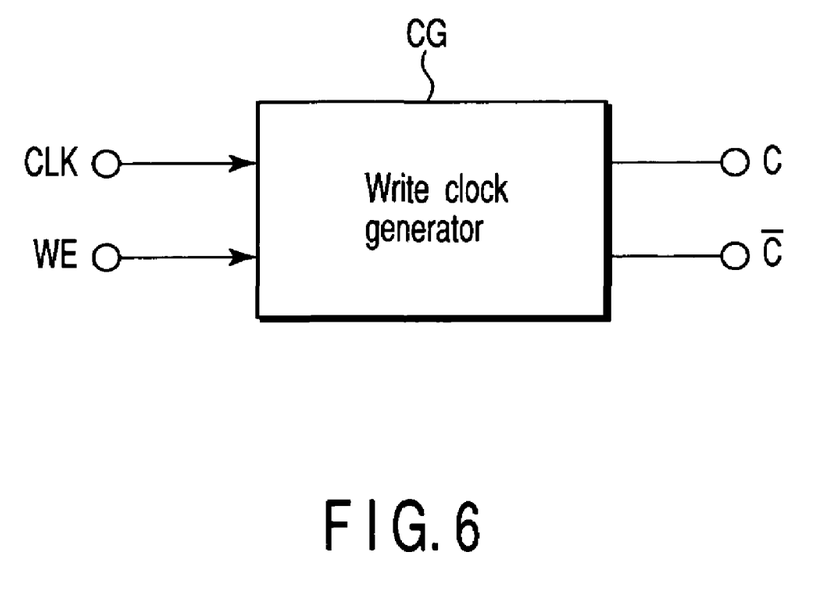
FIG. 6 is a block diagram of a write clock generating circuit which generates control clocks for the clocked inverters in FIG. 5.

Write clocks c and /c applied are supplied to each of the clocked inverters IW1 and IW3, which are generated by a write clock generating circuit CG shown in FIG. 6 in accordance with a clock signal CLK and a write enable signal WE which are to be described later.

The operations of the SRAM circuit shown in FIG. 5 and the write clock generating circuit CG of FIG. 6 will be described next with reference to timing diagrams shown in FIGS. 7A through 7K.

Figure 7A:
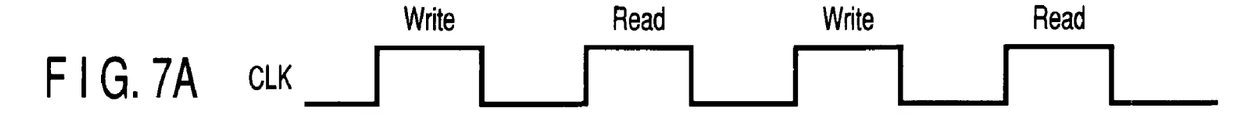
Figure 7B:
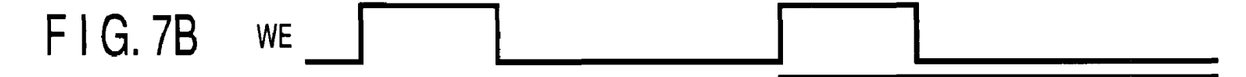

In FIG. 7A, switching is made between the write and read modes with each cycle of the clock signal CLK in response to the write enable signal WE shown in FIG. 7B. That is, as shown in FIGS. 7A and 7B, when the write enable signal WE is at a high level at each positive-going transition of the clock waveform, the write mode results; otherwise, the read mode results.

Figure 7C:
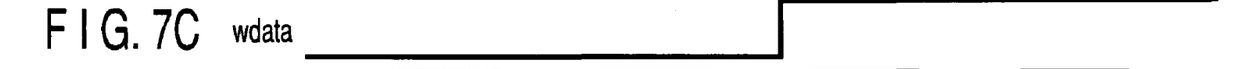
Figure 7D:
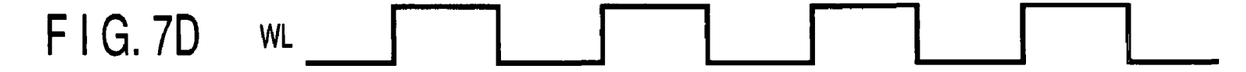

FIG. 7C shows a waveform of the write data wdata, which is illustrated here as data which is at a low level during the former two cycles of four cycles of the clock signal CLK and at a high level during the latter two cycles. FIG. 7D shows a word line select signal WL which is applied to, for example, the word line WL1 in FIG. 5. In the SRAM cells shown in FIG. 5, the transfer gate transistors such as those T1 and T2 are all NMOS transistors. These transistors are turned ON at the time when the corresponding word select signal WL go to a high level, i.e., at about the same time the clock signal CLK goes high as shown in FIF. 7D, so that data can be written into or read from the SRAM cells.

Figure 7E:
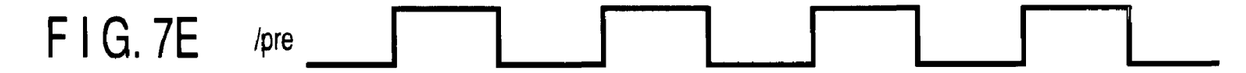

FIG. 7E shows the inverted precharge signal /pre, which goes high in either of the read and write modes in synchronization with the word line select signal WL. Therefore, the PMOS transistors such as that Pt1, for example, connected to the precharge line PL is turned ON only during the intervals when the signal /pre is low, i.e., the intervals followed by the write intervals Write and the read intervals Read of the clock signal shown in FIG. 7A, allowing a given precharge potential to be applied from the precharge source Ps to the bit lines BL1 through BLn and /BL1 through /BLn.

Figure 7F:
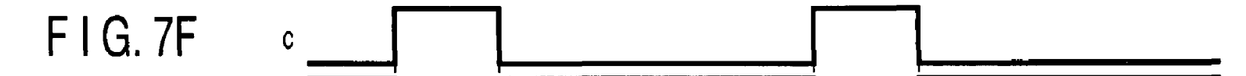
Figure 7G:
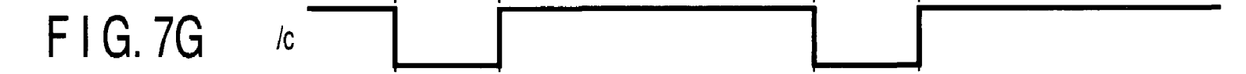

FIGS. 7F and 7G show the complementary write clock signals c and /c which control the clocked inverters IW1 and IW3 in the data write circuit W1. These write clock signals c, /c are generated in synchronization with the clock signal CLK only when the write enable signal WE is high as shown in FIGS. 6, 7A, 7B, 7F, and 7G.

Figure 7H:
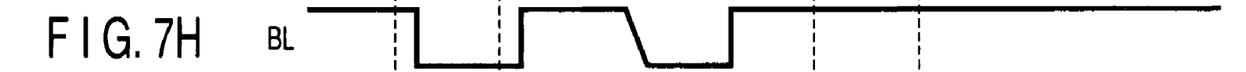
Figure 7I:
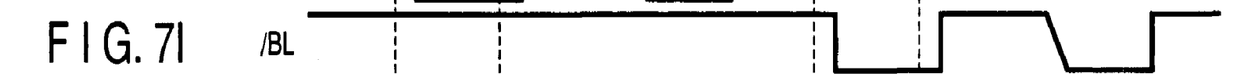
Figure 7J:
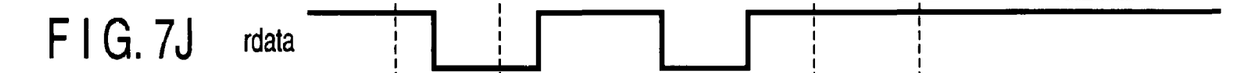
Figure 7K:
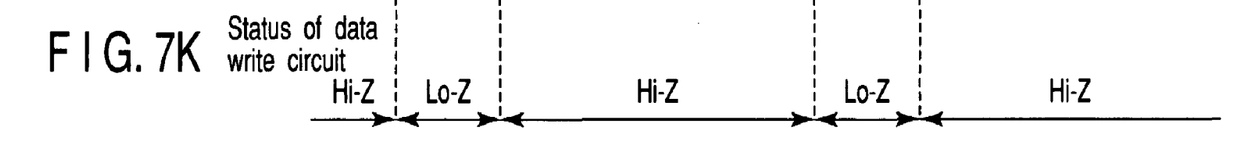

FIG. 7K shows the state of the write circuit. When the control signals c and /c are low and high, respectively, none of the clocked inverters IW1 and IW3 operates. Thus, the state of the write circuit in this case is in a high resistance state Hi-Z. During the period when the write enable signal WE is high, on the other hand, the control signals c and /c go high and low, respectively, enabling the clocked inverters IW1 and IW3. The state of the write circuit in this case is in a low resistance state Lo-Z.

For example, at the time of writing the data "0", the write data wdata is at a low level, causing a low-level potential to be applied to the bit line BL1 via the inverters IW2 and IW1 as shown in FIG. 7H and a high-level potential to be applied to the bit line /BL1 via the inverter IW3 as shown in FIG. 7I. As the result, the low-level data is stored at the data storage node n1 connected to the transfer gate transistor T1 in the selected SRAM cell SC11 by way of example and the high-level data is stored at the storage node /n1 connected to the transfer gate transistor T2.

For the data "1", the high-level data is stored at the storage node n1 on the bit line BL1 side and the low-level data is stored at the storage node /n1 on the bit line /BL1 side in the cell SC11.

If, at data read time, the cell output on the bit line BL1 side is low, the high-level potential on the bit line BL1 precharged through the PMOS transistor Pt1 in accordance with the /pre signal goes low a short time after the read cycle Read has began as shown in FIG. 7H. The read data rdata also goes low slightly later than the potential on the bit line BL1 as shown in FIG. 7J.

If the cell output on the bit line BL1 side is high, no change occurs in the level of the read data rdata as shown in FIG. 7J.

With the embodiment shown in FIG. 5, as descried above, when the bit line BL1 is precharged, at write or read time, to the high level in accordance with the inverted precharge signal /pre on the precharge line PL, the inverse of the high-level potential on the bit line is applied by the inverter IR1 to the gate of the state holding PMOS transistor Pt2. As the result, the transistor Pt2 turns on and acts in the direction to maintain the precharge potential on the bit line BL1, allowing compensation for a drop in the bit line potential due to leakage currents from the SRAM cells and prevention of the occurrence of data readout errors.

Although the embodiment of FIG. 5 has been described as constructing one SRAM cell from six transistors as exemplified by the SRAM cell SC11, the principles of the invention is also applicable to SRAM cells each comprising a different number of transistors, for example, four transistors. Additionally, although the embodiment has be described as keeping the potential on the bit line precharged to the high level when read data is at the high level, the principles of the invention is also applicable to the case where, when read data is at a low level, the bit line is precharged to that low level and kept at the low-level potential. The other embodiments of the present invention will also be described in terms of SRAM cells of six-transistor type and high-level read data as in the case of the embodiment of FIG. 5. Of course, these embodiments can be modified as mentioned above.

With the SRAM circuit configured as shown in FIG. 5, when the bit line BL1 side output of a selected cell is low, the precharged high potential on the bit line BL1 must drop rapidly so that the data read circuit R1 can detect this potential drop. However, since the state holding PMOS transistor Pt2 acts in the direction to prevent the potential on the bit line BL1 from dropping, data reading speed will be lowered.

Figure 1:
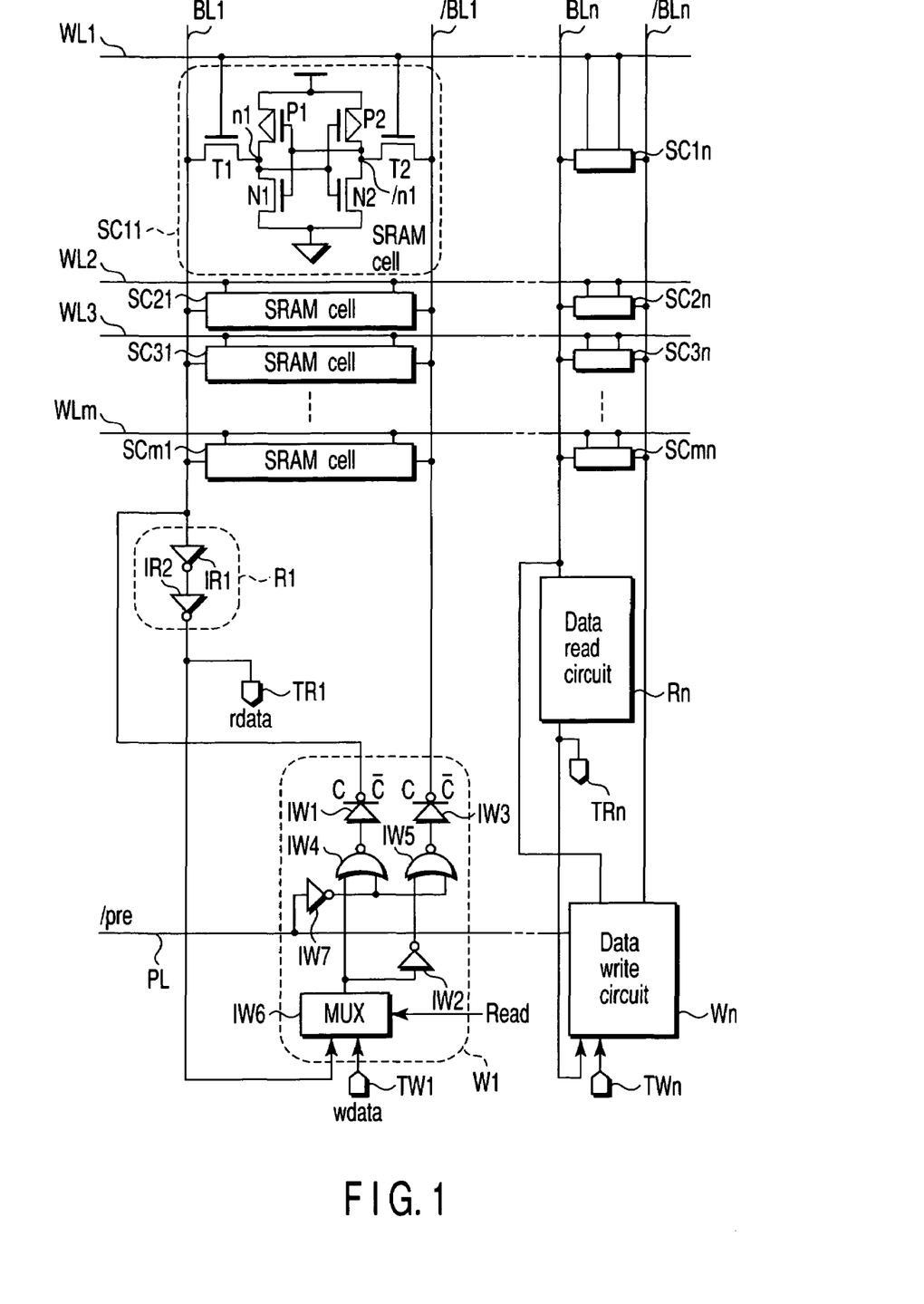
FIG. 1 is a schematic and block diagram representation of an SRAM according to an embodiment of the present invention.

The embodiment shown in FIG. 1, which is an improved version of the embodiment of FIG. 5 to eliminate such a disadvantage, can cope with an increase in off leakage current of each of the transfer gate transistors of cells and further, can implement a high-speed SRAM.

In FIG. 1, the parts corresponding to those in FIG. 5 are denoted by the same or like reference numerals and descriptions thereof are omitted.

The embodiment of FIG. 1 differs from the embodiment of FIG. 5 in the arrangements of the data read circuits R1 to Rn and the data write circuits W1 to Wn. Each of the data read circuits R1 to Rn is composed of only the two series-connected inverters IR1 and IR2 and connected to a corresponding one of the bit lines BL1 to BLn as shown in FIG. 1.

Each of the data write circuits W1 to Wn has, as in the embodiment of FIG. 5, the clocked inverter IW1 connected to the bit line BL1 and the clocked inverter IW3 connected to the bit line /BL1 as exemplified by the circuit W1. The input terminals of the clocked inverters IW1 and IW3 are connected to the output terminals of two-input NOR gates IW4 and IW5, respectively. Each of the NOR gates has its input terminal connected to the precharge line PL via an inverter IW7 to receive the inverted precharge signal /pre. The NOR gate IW4 has its other input terminal directly connected to the output terminal of a multiplexer IW6. The other input terminal of the NOR gate IW5 is connected to the output terminal of the multiplexer IW6 via an inverter IW2. The multiplexer IW6 has its input terminal connected to the data output terminal associated with the bit line BL1 and its other input terminal connected to the input terminal TW1 for write data wdata.

The multiplexer IW6 is supplied with a read mode signal Read to allow, in the write mode, write data wdata applied to the input terminal TW1 to pass through and, in the read mode, read data rdata from the bit line BL1 to pass through.

Figure 2A:
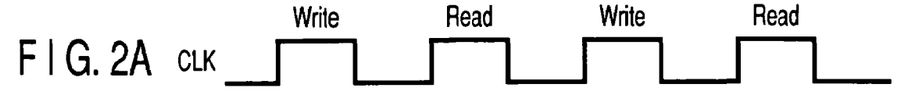
Figure 2B:
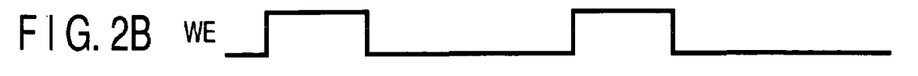
Figure 2C:
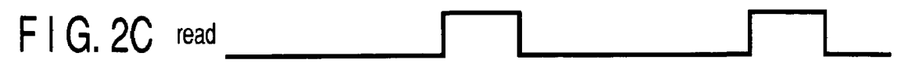

The operation of the embodiment of FIG. 1 will be described in detail below with reference to the timing diagrams of FIGS. 2A through 2M, which differ from FIGS. 7A through 7K in a read mode switching signal "read" shown in FIG. 2C, a timer output signal tmout shown in FIG. 2G (and refer to FIG. 3), and a data write circuit status signal in FIG. 2M. The write clocks c and /c are generated by the clock generating circuit CG of FIG. 3 during time intervals when the write enable signal WE is low. Here, each of the clocks c and /c starts at the positive-going edge of the timer output signal tmout synchronized with the read mode switching signal "read" and ends at the negative-going edge of the signal tmout. The other signals are the same as in FIGS. 7A through 7K.

Figure 2G:
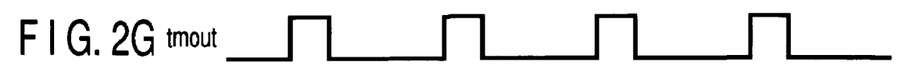
Figure 2H:
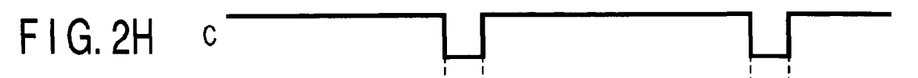
Figure 2I:
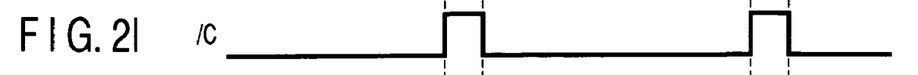
Figure 3:
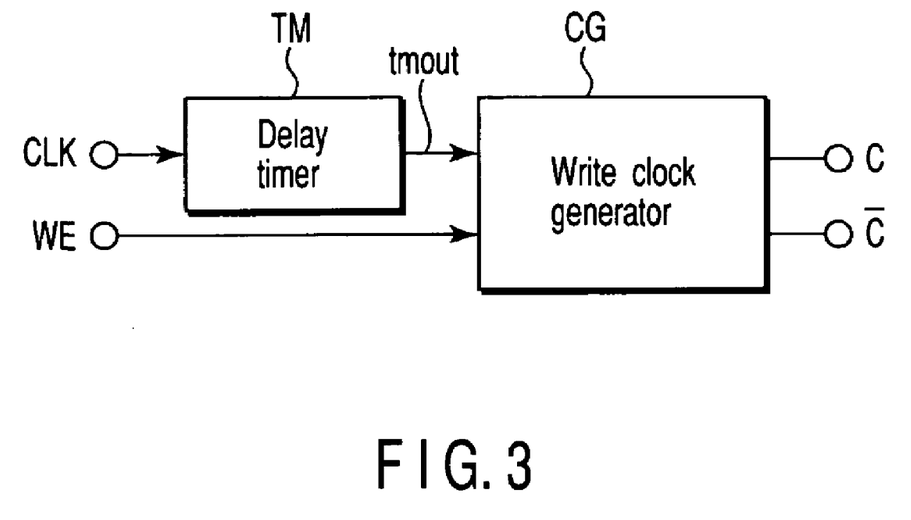
FIG. 3 is a block diagram of a write clock generating circuit which generates control clocks for the clocked inverters in FIG. 1.

Reference is made here to FIG. 3 to explain an example of the arrangement of the write clock generating circuit CG. In FIG. 3, the timer output signal tmout is obtained as the output of a delay timer TM adapted to produce a pulse having a predetermined duration within the Write and Read periods of the clock signal CLK, as shown in FIG. 2G. The timer output signal tmout is supplied together with the write enable signal WE to the write clock generating circuit CG, which thereby produces the complementary write clock signals c and /c as shown in FIGS. 2H and 2I.

That is, as shown in FIGS. 2G, 2H, 2I and 2M, the clocked inverters IW1 and IW3 are disabled only during the time intervals when the timer output signal tmout is high in the data read period, putting each of the data write circuits W1 to Wn into the Hi-Z state. During the other intervals, the write circuits W1 to Wn are placed in the Lo-Z state.

The operation of the SRAM of FIG. 1 will be described in detail below with reference to the timing diagrams of FIGS. 2A through 2M. As with the circuit of FIG. 5, the circuit of FIG. 1 operates in the three modes: precharge, write, and read.

Figure 2D:
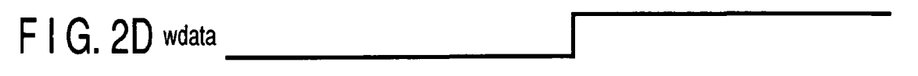
Figure 2E:
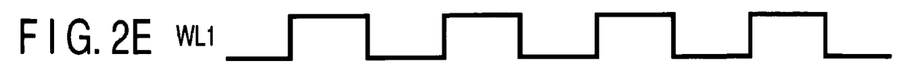

Suppose, for example, that, in the data write mode, the write data wdata of FIG. 2D supplied to the write circuit W1 is low. If, in this state, the read designation signal "read" of FIG. 2C is low, a signal at the low level is outputted from the multiplexer IW6, which is directly supplied to the NOR gate IW4 on one hand, and a signal at the high level obtained through the inverter IW2 is supplied to the NOR gate IW5 on the other hand.

Figure 2F:
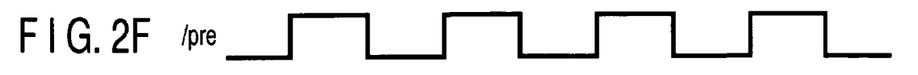

Immediately prior to the Write period when the write enable signal WE of FIG. 2B goes high, the inverted precharge signal /pre of FIG. 2F is low. That is, the precharge voltage obtained from the inverter IW7 is high. Thus, the output of the NOR gate IW4 is low and the output of the clocked inverter IW1 is high, so that the bit line BL1 is supplied with the precharge voltage.

On the other hand, the output of the NOR gate IW5 is also low and hence the output of the clocked inverter IW3 is high, allowing the precharge voltage of the high level to be applied to the bit line /BL1. In this way, the bit lines BL1 and /BL1 are precharged to the high level by the write circuit W1.

In this state, the write enable signal WE goes high and the clock CLK also goes high. Suppose here that the word line WL1 is selected and, thereby, the supply of the precharge voltage is stopped. Assume here that the write data is low. Then, as shown in the former clock part of FIGS. 2J and 2K, the potential at the low level is applied from the clocked inverter IW1 to the bit line BL1 and the potential at the high level is applied from the clocked inverter IW3 to the bit line /BL1, thereby performing the data write operation into the SRAM cell SC11.

Figure 2J:
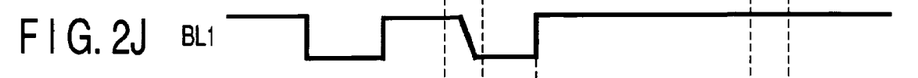
Figure 2K:
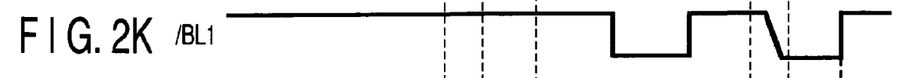
Figure 2L:
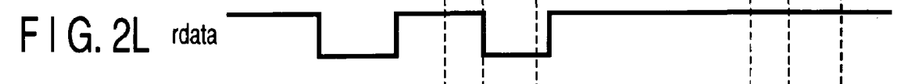
Figure 2M:
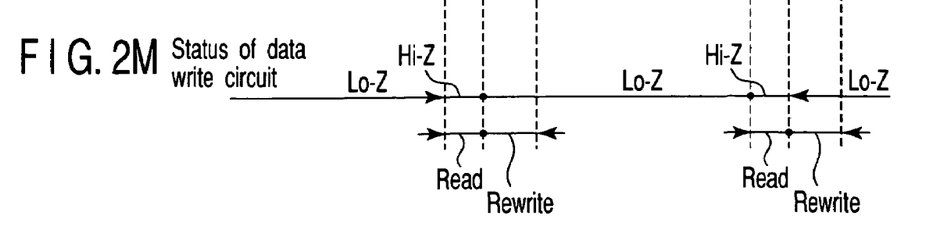

On the other hand, when the write data wdata has a high level as shown in FIG. 2D, the potential on each of the bit lines BL1 and /BL1 is reversed as shown in the latter clock part of FIGS. 2J and 2K.

Next, at read time, when the signal WE goes low before the read designation signal "read" goes high, the inverted precharge voltage /pre goes low, that is, the precharge voltage goes high. Thereby, the bit lines BL1 to BLn and /BL1 to /BLn are precharged to the high level as in the case of the aforementioned write time. In this state, when the timer signal tmout is applied from the delay timer TM to the write clock generating circuit CG, the write clock c goes low, while the clock /c goes high. Thereby, the clocked inverters IW1 and IW3 are disabled, putting the data write circuit W1 into the Hi-Z state.

When, in this state, the word line WL1 is activated as shown in FIG. 2E, data rdata is read out from the SRAM cell SC11 onto the bit lines BL1 and /BL1, for example. At this point, one of the bit lines BL1 and /BL1 is maintained at the precharged high level according to data stored in the SRAM cell SC11. Since the data write circuit W1 is in the Hi-Z state, the bit line potential maintained at the high level is placed in substantially the floating state.

The read data is sent from the SRAM cell SC11 over the bit line BL1 to the data read circuit R1. At the time the read data appears at the output terminal TR1 after a period of time corresponding to the delay at the delay timer TM has lapsed, the polarity of each of the outputs c and /c of the write clock generating circuit CG is reversed in accordance with the timer output tmout of FIG. 2G from the delay timer TM. As a result, the data write circuit W1 is placed in the Lo-Z state, allowing the read data to be applied to the multiplexer IW6. When low-level data and high-level data are read via the bit lines BL1 and /BL1, respectively, as shown in FIGS. 2J and 2K, the low-level data on the bit line BL1 is rewritten onto the bit line BL1 through the NOR gate IW4 and the clocked inverter IW1. On the other hand, the read data inverted to the high level by the inverter IW2 is rewritten onto the bit line /BL1 through the NOR gate IW5 and the clocked inverter IW3. At this time, the bit line /BL1 which has been maintained at the high level and placed in the floating state is released from the floating state.

Likewise, when high-level and low-level data are read via the bit lines BL1 and /BL1, respectively, each read data is rewritten onto the corresponding bit line.

During the interval when data is read out, i.e., during the interval from when, for example, the word line WL1 is activated until read data is sent to the output terminal TR1 of the data read circuit R1, the bit line BL1 or /BL1 is placed in the floating state. During this interval, no potential maintaining operation is performed from outside with respect to the bit lines BL1 and /BL1. However, too long a floating interval might cause the potential of the bit line at the high level to drop. Therefore, the allowable period of the floating time is determined by the bit line capacitance and the sum of off leakage currents of the transfer gate transistors of SRAM cells connected to the bit lines. To hold data, the data is simply rewritten from the data write circuit W1 onto the bit lines BL1 and /BL1 within the allowable floating time period. The same applies to the other bit lines.

Thus, the SRAM shown in FIG. 1 is configured to rewrite read data onto a corresponding bit line at a given timing, thereby allowing the bit lines to go into the floating state at read time. Therefore, any potential maintaining operation which is performed from outside is not required and the speed of the SRAM can be increased in the data read mode. Additionally, the embodiment of FIG. 1 is simpler in the arrangement of the data read circuit than the embodiment shown in FIG. 5. Although the number of constituent elements used in the data write circuit increases, the circuit area will not greatly increase as a whole.

Although the embodiment of FIG. 1 has been described as being of the so-called one-port configuration in which read data from one SRAM cell is applied to the paired bit lines BL and /BL, the principles of the invention is equally applicable to an SRAM of the so-called two-port type in which write or read data to or from different SRAM cells are applied to paired bit lines. An embodiment of the two-port type SRAM will be described hereinafter with reference to FIG. 4.

Figure 4:
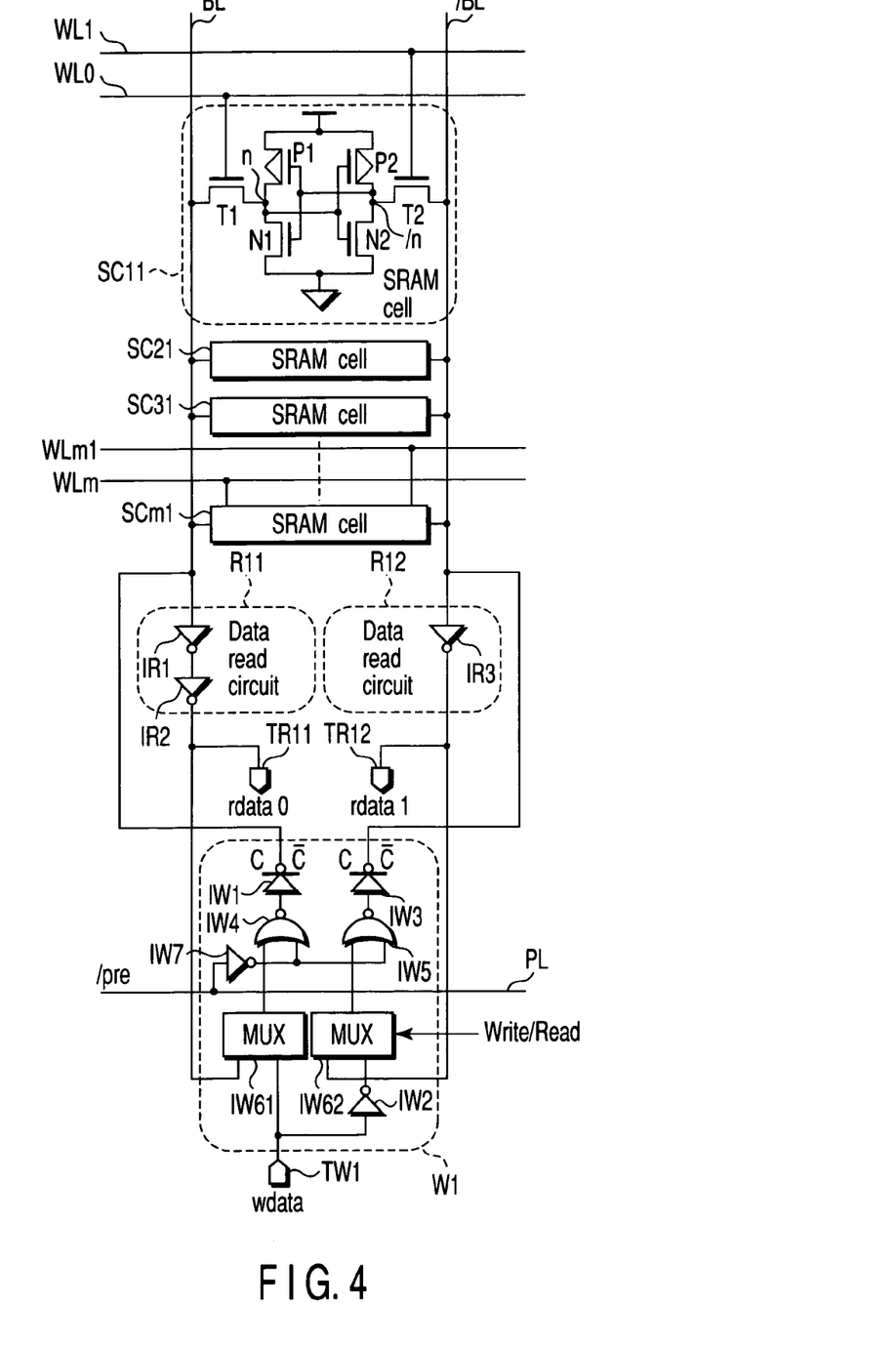
FIG. 4 is a schematic and block diagram representation of an SRAM according to another embodiment of the present invention.

In FIG. 4, unlike FIGS. 1 and 5, only one pair of bit lines BL and /BL and its associated circuitry are illustrated with other pairs of bit lines and their associated circuitry omitted. In FIG. 4, to implement the two-port configuration, pairs of two word lines WL0, WL1 to WLm, WLm1 are connected to each of the SRAM cells SC11 to SCm1 connected between the paired bit lines BL and /BL. In FIG. 4, only a pair of two word lines WL1 and WL0 and a pair of two word lines WLm and WLm1 connected to the SRAM cell SC11, SCm1 are illustrated for the purpose of simplifying illustration. The word line WL0 is connected to the gate of the transfer gate transistor T1 in the SRAM cell SC11, while the word line WL1 is connected to the gate of the transfer gate transistor T2 in the same cell SC11. The circuit arrangement of the SRAM cell SC11 remains unchanged from that shown in FIGS. 1 and 5.

A first data read circuit R11 is connected to the bit line BL, while a second data read circuit R12 is connected to the bit line /BL. The first data read circuit R11 is composed of two inverters IR1 and IR2 connected in series. The second data read circuit R12 is comprised of one inverter IR3. The output of the data read circuit R11 is connected to an output terminal TR11 and to an input of a multiplexer IW61 in the data write circuit W1. The data read circuit R12 has its output connected to an output terminal TR12 and to an input of a multiplexer IW62 in the data write circuit W1.

The data write circuit W1 comprises an inverter IW2 connected between the write data input terminal TW1 and an input of the multiplexer IW62, the NOR gates IW4 and IW5 having one input connected to the precharge line PL via an inverter IW7 and the other input connected to the output of the multiplexers IW61 and IW62, respectively, and the clocked inverters IW1 and IW3 respectively connected in series with the NOR gates IW4 and IW5. As in FIG. 1, the inverter IW7 is connected between the precharge line PL and the NOR gates IW4 and IW5.

In the SRAM circuit of FIG. 4, a precharge operation is performed prior to each of the data read and write operations. When a low-level inverted precharge voltage /pre is applied to the precharge line PL, each of the outputs of the NOR gates IW4 and IW5 goes low. At this point, since the clocked inverters IW1 and IW3 are enabled, a high-level precharge voltage as the result of inversion is applied to the bit lines BL and /BL, so that they are precharged.

In the data write mode, write data wdata is applied to the data input terminal TW1. A high-level voltage is applied to one of the bit lines BL and /BL, while a low-level voltage is applied to the other, depending on the write data contents. For example, when the word lines WL0 and Wl1 are activated, the SRAM cell SC11 is selected and consequently data is written into it.

At data read time, by selectively activating the word line WL0 or WL1, data stored in the SRAM cell SC11 can be read separately as different data onto the bit lines BL and /BL via corresponding data storage node n or /n. For this reason, data read out onto each of the bit lines BL and /BL can be rewritten through the data write circuit W1 onto the corresponding bit line to hold the potentials on the respective bit lines for a given period of time after the data read operation is started.

Suppose, for example, that only the word line WL0 is activated. As the result, data is read from the SRAM cell SC11 onto only the bit line BL, then output to the data output terminal rdata0 via the data read circuit R11 on one hand and rewritten onto the bit line BL via the multiplexer IW61 in the data write circuit W1 on the other hand.

In the case as well where only the word line WL1 is activated, data is read from the SRAM cell SC11 onto only the bit line /BL, then output to the data output terminal rdata1 via the data read circuit R12 on one hand and rewritten onto the bit line /BL via the multiplexer IW62 in the data write circuit W1 on the other hand.

Thus, even in the case of two-port configuration, as in the embodiment shown in FIG. 1, read data can be rewritten onto the corresponding bit line and held on it. In addition, since the bit line at the high level is temporarily placed in the floating state at data read time as in the embodiment of FIG. 1, any potential holding circuit adapted to hold the potential on the corresponding bit line is not required and hence no decrease in the operating speed resulting from such potential holding circuit occurs.

According to the embodiments of the present invention, as described in detail above, a high-speed semiconductor memory device can be provided which, at the time of reading data from an SRAM cell, can prevent a drop in the potential on a precharged bit line due to off-leakage currents of transfer gate transistors to prevent read errors from occurring and is capable of high-speed read operations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of bit line pairs each having first and second bit lines arranged in a first direction;
a cell array having a plurality of SRAM cells each of which is connected between the first and second bit lines of a corresponding bit line pair via first and second storage nodes, respectively;
a plurality of word lines arranged in a second direction crossing the first direction; and
a data write circuit which, in the write mode, writes data into an SRAM cell selected by a word line via the first and second bit lines and, in the read mode, rewrites data read onto the first bit line from an SRAM cell selected by a word line onto a first writing bit line;
wherein the write circuit includes a rewrite circuit which, when data corresponding to a precharge potential is read from the first bit line in the read mode, recharges the first bit line to the precharge potential on the basis of the read data.

2. A semiconductor memory device comprising: a plurality of bit line pairs each having first and second bit lines arranged in a first direction;
a cell array having a plurality of SRAM cells each of which is connected between the first and second bit lines of a corresponding bit line pair via first and second storage nodes, respectively;
a plurality of word lines arranged in a second direction crossing the first direction; and
a data write circuit which, in the write mode, writes data into an SRAM cell selected by a word line via the first and second bit lines and, in the read mode, rewrites data read onto the first bit line from an SRAM cell selected by a word line onto a first writing bit line;
wherein the write circuit includes a stop circuit which stops the operation of rewriting read data onto the bit line until read data is outputted to a data read output terminal in the read mode.

3. The semiconductor memory device according to claim 2, wherein the stop circuit includes a delay circuit which delays the operation of rewriting read data onto the bit line until read data is outputted to a data read output terminal in the read mode.

4. The semiconductor memory device according to claim 2, wherein the write circuit includes a precharge circuit which precharges the bit lines at times prior to the start of the read and write modes.

5. The semiconductor memory device according to claim 3, wherein the write circuit includes a precharge circuit which precharges the bit lines at times prior to the start of the read and write modes.

6. A semiconductor memory device comprising:
a plurality of bit line pairs each having first and second bit lines arranged in a first direction;
a cell array having a plurality of SRAM cells each of which is connected between the first and second bit lines of a corresponding bit line pair via first and second transfer gates having first and second storage nodes, respectively;
first and second word lines arranged in a second direction crossing the first direction and connected to the first and second transfer gates, respectively; and
a data write circuit which, in the write mode, writes data into an SRAM cell selected by the first and second word lines via the first and second bit lines and, in the read mode, rewrites data read onto at least one of the first and second bit lines from an SRAM cell selected by an activated one of the first and second word lines onto the bit line onto which the data has been read.

7. The semiconductor memory device according to claim 6, wherein the write circuit includes a rewrite circuit which recharges one of the first and second bit lines to a precharge potential onto which data corresponding to a precharge potential has been read in the read mode.

8. The semiconductor memory device according to claim 6, wherein the write circuit includes a stop circuit which stops the operation of rewriting read data onto the bit line until read data is outputted to a data read output terminal in the read mode.

9. The semiconductor memory device according to claim 8, wherein the stop circuit includes a delay circuit which delays the operation of rewriting read data onto the bit line until read data is outputted in the read mode.

10. The semiconductor memory device according to claim 8, wherein the write circuit includes a precharge circuit which precharges the bit lines at times prior to the read and write modes.

11. The semiconductor memory device according to claim 9, wherein the write circuit includes a precharge circuit which precharges the bit lines at times prior to the read and write modes.

* * * * *